United States Patent
Liu et al.

(10) Patent No.: US 10,396,062 B2
(45) Date of Patent: Aug. 27, 2019

(54) MICRO LIGHT EMITTING DIODE DISPLAY PANEL

(71) Applicant: PlayNitride Inc., Tainan (TW)

(72) Inventors: Ying-Tsang Liu, Tainan (TW); Yu-Chu Li, Tainan (TW); Pei-Hsin Chen, Tainan (TW); Yi-Ching Chen, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 16/053,779

(22) Filed: Aug. 2, 2018

(65) Prior Publication Data

US 2019/0043844 A1    Feb. 7, 2019

(30) Foreign Application Priority Data

Aug. 3, 2017   (TW) ............................. 106126172 A

(51) Int. Cl.
  *H01L 25/16*     (2006.01)
  *H01L 25/075*    (2006.01)
  *H01L 33/62*     (2010.01)

(52) U.S. Cl.
  CPC ........ *H01L 25/167* (2013.01); *H01L 25/0753* (2013.01); *H01L 33/62* (2013.01)

(58) Field of Classification Search
  CPC .... H01L 25/0753; H01L 25/167; H01L 33/62
  See application file for complete search history.

(56) References Cited

U.S. PATENT DOCUMENTS

| | | | |
|---|---|---|---|
| 2012/0229532 A1* | 9/2012 | Chen | G09G 3/32 345/697 |
| 2014/0367633 A1* | 12/2014 | Bibl | G02F 1/133603 257/13 |
| 2016/0093600 A1* | 3/2016 | Bower | H01L 25/18 257/89 |
| 2017/0187976 A1* | 6/2017 | Cok | H04N 5/376 |

* cited by examiner

*Primary Examiner* — Peniel M Gumedzoe
(74) *Attorney, Agent, or Firm* — JCIPRNET

(57) ABSTRACT

A micro light emitting diode display panel including a substrate, a plurality of control elements, and a plurality of light emitting units is provided. The control elements and the light emitting units are disposed on the substrate. Each of the light emitting units is electrically connected to one of the control elements, and each of the light emitting units includes a plurality of micro light emitting diodes. The micro light emitting diodes at least have a red micro light emitting diode, a green micro light emitting diode, and a blue micro light emitting diode. A shortest distance between the green micro light emitting diode and the one of the control elements is less than a shortest distance between the blue micro light emitting diode and the one of the control elements.

12 Claims, 8 Drawing Sheets

MICRO LIGHT EMITTING DIODE DISPLAY PANEL

CROSS-REFERENCE TO RELATED APPLICATION

This application claims the priority benefit of Taiwan application serial no. 106126172, filed on Aug. 3, 2017. The entirety of the above-mentioned patent application is hereby incorporated by reference herein and made a part of this specification.

BACKGROUND OF THE INVENTION

1. Field of the Invention

The invention relates to a display panel, and more particularly, to a micro light emitting diode display panel.

2. Description of Related Art

With evolution in optoelectronic technology, a solid light source (e.g., a light emitting diode) has been widely applied in various fields, such as road lighting, large outdoor billboards, traffic signal lighting. In recent years, a micro light emitting diode display panel has been developed to allow each of sub-pixels to be driven separately for light emitting by using micro light emitting diodes as the sub-pixels in the display panel.

Because control elements for driving the micro light emitting diodes are opaque and have large size, the control elements are usually disposed on a periphery region of the micro light emitting diode display panel so as to prevent a display quality from being affected. However, the control elements disposed on the periphery region of the micro light emitting diode display panel will increase a border width, and lead to difficulties in meeting the demands for a narrow boarder. Accordingly, finding a way to take both the display quality and the narrow boarder into consideration has become one of the issues to be solved by the developers in the field.

SUMMARY OF THE INVENTION

The invention is directed to a micro light emitting diode display panel, which can include both the better display quality and the narrower border.

A micro light emitting diode display panel of the invention includes a substrate, a plurality of control elements, and a plurality of light emitting units. The substrate includes a plurality of pixel regions arranged in a display area. The control elements and the light emitting units are disposed on the substrate and in the display area. Each of the light emitting units is electrically connected to one of the control elements, and each of the light emitting units includes a plurality of micro light emitting diodes. The micro light emitting diodes at least have a red micro light emitting diode, a green micro light emitting diode, and a blue micro light emitting diode. A shortest distance between the green micro light emitting diode and the one of the control elements is less than a shortest distance between the blue micro light emitting diode and the one of the control elements.

In an embodiment of the invention, each of the control elements is a circuit chip electrically bonded to the substrate.

In an embodiment of the invention, a shortest distance between the red micro light emitting diode and the one of the control elements is less than the shortest distance between the blue micro light emitting diode and the one of the control elements.

In an embodiment of the invention, in each of the light emitting units, an area of the red micro light emitting diode is greater than an area of the green micro light emitting diode and an area of the blue micro light emitting diode.

In an embodiment of the invention, an area of each of the control elements is 1 to 50 times an area of the red micro light emitting diode, an area of the green micro light emitting diode or an area of the blue micro light emitting diode.

In an embodiment of the invention, the pixel regions and the light emitting units are equal in number. There are only one of the light emitting units and one of the control elements electrically connected to the one of the light emitting units in each of the pixel regions.

In an embodiment of the invention, in each of the pixel regions, the control element and the blue micro light emitting diode are located along a diagonal line, and the red micro light emitting diode and the green micro light emitting diode are located along another diagonal line.

In an embodiment of the invention, the pixel regions include a plurality of first pixel regions and a plurality of second pixel regions. The first pixel regions are separately sequentially arranged in a first direction, the second pixel regions are sequentially arranged in the first direction, and the first pixel regions and the second pixel regions are alternately arranged in a second direction perpendicular to the first direction. An arrangement between the control element and the light emitting unit in each of the first pixel regions is different from an arrangement between the control element and the light emitting unit in each of the second pixel regions In an embodiment of the invention, the control element is located on one side of the light emitting unit and adjacent to the green micro light emitting diode of the light emitting unit in each of the pixel regions.

In an embodiment of the invention, a projected area of each of the control elements on the substrate is 1 to 50 times that of one of the micro light emitting diodes.

In an embodiment of the invention, each of the micro light emitting diodes is a light emitting diode chip with a side length between 3 μm to 150 μm.

In an embodiment of the invention, the pixel regions and the light emitting units are equal in number. A number of the light emitting units in each of the pixel regions is one. Each of the control elements is electrically connected to the light emitting units.

In an embodiment of the invention, the light emitting unit is located on one side of the control element, and the green micro light emitting diode, the blue micro light emitting diode and the red micro light emitting diode are arranged sequentially away from the control element in each of the pixel regions.

Based on the above, in the micro light emitting diode display panel according to the embodiments of the invention, the border width may be effectively reduced by disposing the control element in the pixel region. Among the red light, green light and blue light, given that human eyes are most sensitive to green light and least sensitive to blue light, by disposing the control element at a position closer to the green micro light emitting diode than to the blue micro light emitting diode, obvious dark lines and regularly appeared dark spots may be prevented from being seen. As a result, the micro light emitting diode display panel can include both the better display quality and the narrower border.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
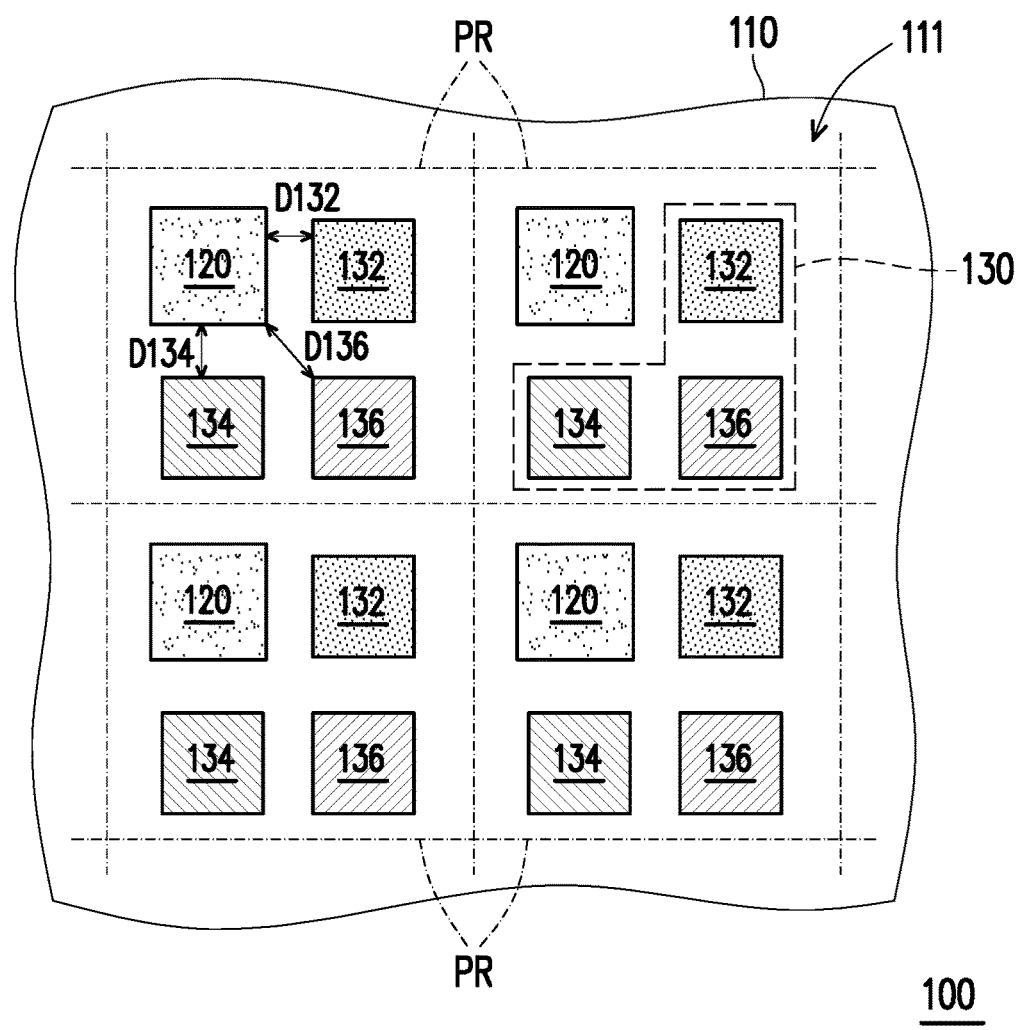
FIG. 1 to FIG. 8 are top views of micro light emitting diode display panels according to the first embodiment to the eighth embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 to FIG. 8 are top views of micro light emitting diode display panels according to the first embodiment to the eighth embodiment of the invention. With reference to FIG. 1, a micro light emitting diode display panel 100 of the first embodiment of the invention includes a substrate 110, a plurality of control elements 120 and a plurality of light emitting units 130 (only one light emitting unit 130 is schematically marked in FIG. 1).

The control elements 120 and the light emitting units 130 are bonded on the substrate 110, and a plurality of wiring lines (not drawn) for electrically connecting the control elements 120 and the light emitting units 130 can be formed on the substrate 110. For instance, the substrate 110 may be a printed circuit board (PCB). Alternatively, the substrate 110 may be a flexible printed circuit (FPC). Alternatively, the substrate 110 may be a glass plate or a ceramic plate.

The control elements 120 are disposed on the substrate 110 to drive the light emitting units 130. The control element 120 may include a circuit element manufactured through a semiconductor fabrication. For instance, each of the control elements 120 may be an integrated circuit chip (e.g. micro IC, microchip, or hybrid integrated circuit), and the control elements 120 may be welded onto the substrate 110. Each control element 120 may include a digital integrated circuit, such as a micro controller in this embodiment, but the invention is not limited thereto. Because a responding time of each control element 120 is faster than that of a thin-film transistor (TFT), frames per second (FPS) of the micro light emitting diode display panel 100 may be improved by using the control elements 120 and control the light emitting units 130 more precision.

The light emitting units 130 are disposed on the substrate 110, and each of the light emitting units 130 is electrically connected to one of the control elements 120. In other words, in the first embodiment, the color and brightness of one light emitting units 130 are controlled by one control element 120.

The substrate 110 includes a display area 111 and a plurality of pixel regions PR in a regular arrangement are defined in the display area 111. The display area 111 means a region for showing image, a TV screen for example. In the first embodiment, the pixel regions PR are disposed in array, and the pixel regions PR are equal to the light emitting units 130 in number. In other words, each of the pixel regions PR includes one light emitting unit 130 and one control element 120 and the one control element 120 is electrically connected to the one light emitting unit 130 in the same pixel region PR. Although the number of the pixel regions PR and the number of the light emitting units 130 are respectively four as illustrated in FIG. 1, the numbers of the pixel regions PR and the emitting units 130 are not limited thereto.

In the embodiment, the control element 120 is disposed in the pixel region PR, so as to effectively reduce a border width of the micro light emitting diode display panel 100.

Each of the light emitting units 130 includes a plurality of micro light emitting diodes. The micro light emitting diodes at least have a red micro light emitting diode (micro LED) 132, a green micro light emitting diode 134, and a blue micro light emitting diode 136. By controlling the red micro light emitting diode 132, the green micro light emitting diode 134 and the blue micro light emitting diode 136 with use of the control element 120 in each of the pixel regions PR, color and gray level of each pixel region PR may be controlled (for example, to control driving current or driving time). The red micro light emitting diode 132, the green micro light emitting diode 134 and the blue micro light emitting diode 136 may be bonded to the substrate 110 through a mass transfer process. Similarly, the control elements 120 may also be bonded to the substrate 110 through the mass transfer process.

Among red light, green light and blue light, human eyes are most sensitive to green light and least sensitive to blue light. In other words, a sub-pixel with the green micro light emitting diode 134 looks brighter than a sub-pixel with the blue micro light emitting diode 136 at the same gray level. Therefore, by disposing the control element 120 adjacent to the green micro light emitting diode 134 and away from the blue micro light emitting diode 136 in each of the pixel regions PR, it is possible to avoid the problem that the human eye sees the dark lines or regular dark spots caused by the concentrated arrangement of the opaque control elements 120 and the blue micro light-emitting diodes 136 having darker appearances. As a result, the micro light emitting diode display panel 100 can include both the better display quality and the narrower border.

For instance, in each of the pixel regions PR, the control element 120 and the blue micro light emitting diode 136 may be located along a diagonal line, and the red micro light emitting diode 132 and the green micro light emitting diode 134 may be located along another diagonal line. A shortest distance D134 between the green micro light emitting diode 134 and the control element 120 is less than a shortest distance D136 between the blue micro light emitting diode 136 and the control element 120, and a shortest distance D132 between the red micro light emitting diode 132 and the control element 120 is less than the shortest distance D136 between the blue micro light emitting diode 136 and the control element 120. The shortest distance between the micro light emitting diode (the red micro light emitting diode 132, the green micro light emitting diode 134 or the blue micro light emitting diode 136) and the control element 120 refers to a shortest distance between an edge of the micro light emitting diode to an edge of the control element 120.

In FIG. 1 that sizes of the red micro light emitting diode 132, the green micro light emitting diode 134 and the blue micro light emitting diode 136 are the same (the tolerance of length/width/height is smaller than 5 um), and the control element 120 is slightly greater than each of these micro light emitting diodes, but the invention is not limited thereto. Based on different applications or display resolution requirements (e.g., applications in large outdoor billboards or portable electronic devices), a projected area of each of the control elements 120 on the substrate 110 may be 1 to 50 times projected areas of the red micro light emitting diode 132, the green micro light emitting diode 134 and the blue micro light emitting diode 136. In addition, the micro light emitting diode refers to, for example, a light emitting diode chip with a side length between 3 μm to 150 μm. A size of the control element 120 depends on the circuit design. When a microelectromechanical systems (MEMS) is used, the size of the control element 120 may be miniaturized to approximate that of the micro light emitting diode. However, because the control element 120 is disposed in the display area 111, it is more preferably that the projected area of the control element 120 is not greater than 50 times the projected area of the micro light emitting diode, so as to prevent the display quality from reducing due to an overly-large dark region or an overly-poor resolution. Moreover, the red micro light emitting diode 132 is currently poor in light-emitting efficiency, and this issue can be solved by making the size of the red micro light emitting diode 132 greater than the size of the green micro light emitting diode 134 and the size of the blue micro light emitting diode 136.

Other possible implementations of the micro light emitting diode display panel are provided below with reference to FIG. 2 to FIG. 8, where identical or similar elements are marked with identical or similar reference numbers, and descriptions regarding the same are not repeated hereinafter.

Figure 2:
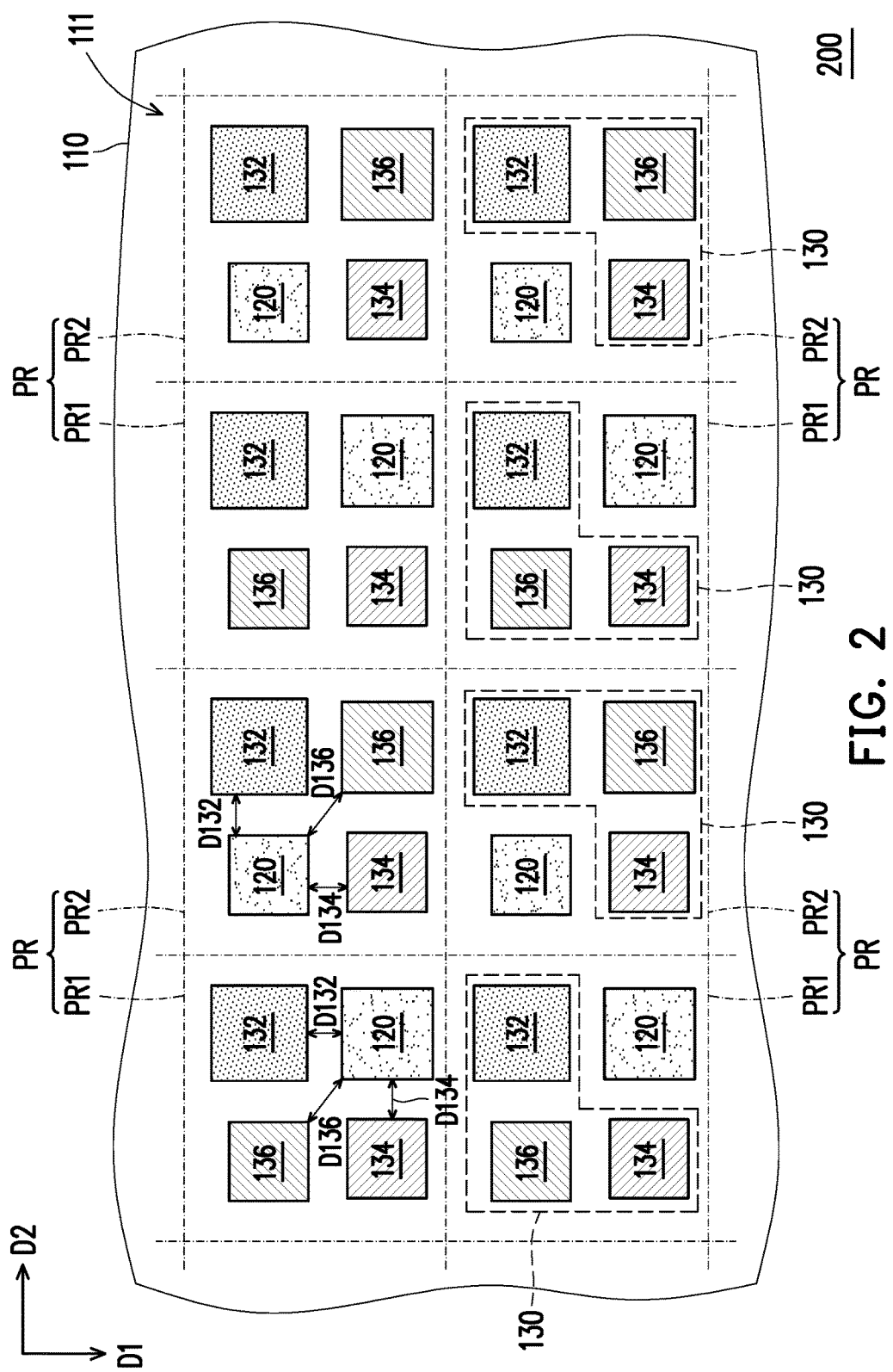

With reference to FIG. 2, a micro light emitting diode display panel 200 of the second embodiment of the invention is similar to the micro light emitting diode display panel 100 of FIG. 1. The major differences between the two are described as follows. In the micro light emitting diode display panel 200, the pixel regions PR include a plurality of first pixel regions PR1 and a plurality of second pixel regions PR2. The first pixel regions PR1 are sequentially arranged in a first direction D1, the second pixel regions PR2 are sequentially arranged in the first direction D1, and the first pixel regions PR1 and the second pixel regions PR2 are alternately arranged in a second direction D2 perpendicular to the first direction D1. The arrangement positions of the control element 120 and the light emitting unit 130 in one of the first pixel regions PR1 are different from the arrangement positions of the control element 120 and the light emitting unit 130 in the second pixel region PR2 adjacent to the one of the first pixel regions PR1. Similar to the embodiment of FIG. 1, the control element 120, the red micro light emitting diode 132, the green micro light emitting diode 134 and the blue micro light emitting diode 136 are located at four corners in one of the pixel regions PR; and the control element 120 and the blue micro light emitting diode 136 are located along a diagonal line. The special design is that the control elements 120 are not arranged on the same position between the first pixel region PR1 and the second pixel region PR2, for instance, the red micro light emitting diode 132 of the first pixel region PR1 is located beside the control element 120 of the second pixel region PR2, and the control element 120 of the first pixel region PR1 is located beside the green micro light emitting diode 134 of the second pixel region PR2. By avoiding putting the opaque control elements 120 on the same line in the second direction D2 and the first direction D1, obvious dark lines can be further prevented from being seen. In other implementations, the first pixel regions PR1 and the second pixel regions PR2 are alternately arranged in both the first direction D1 and the second direction D2.

Figure 3:
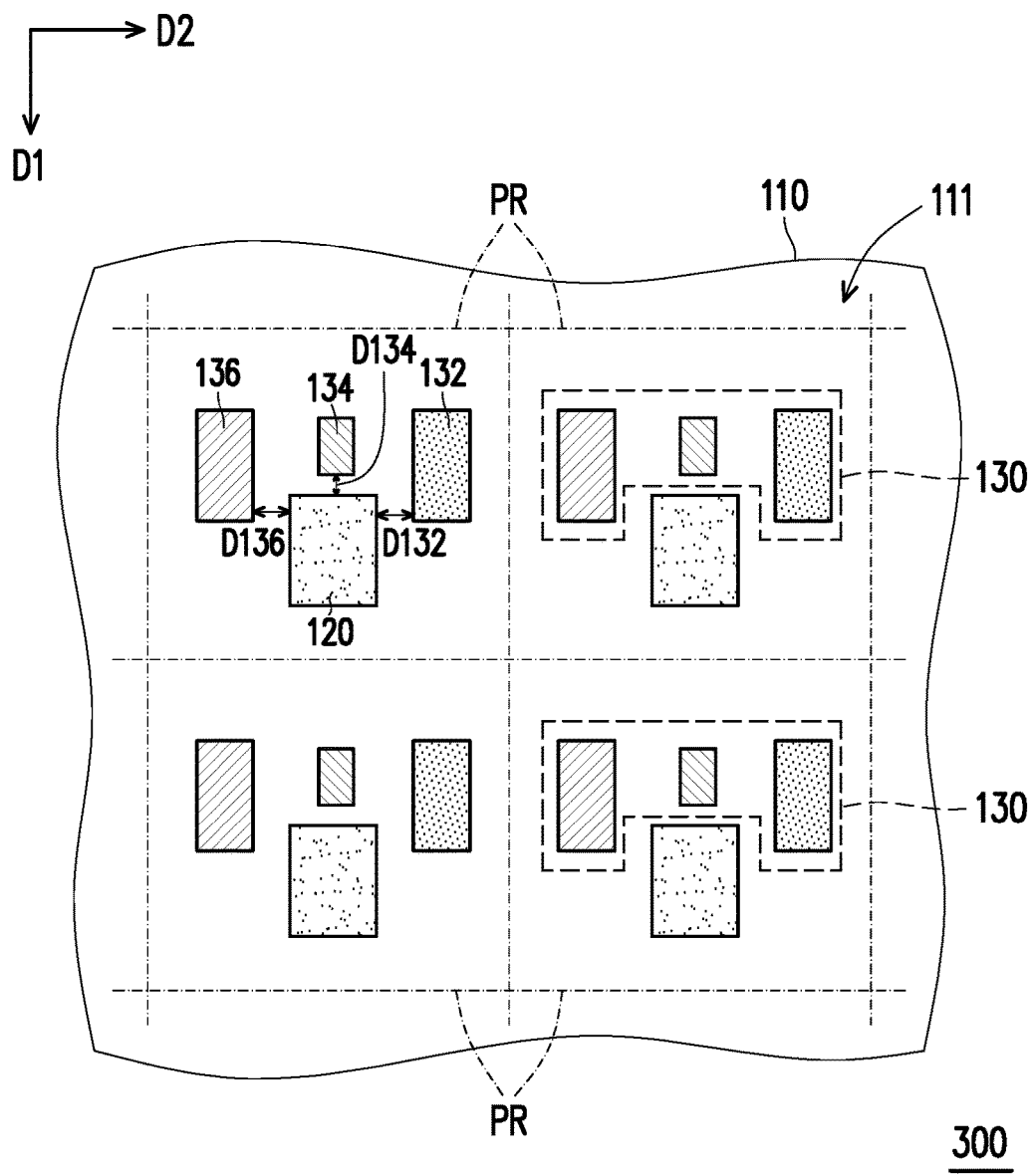

With reference to FIG. 3, a micro light emitting diode display panel 300 of the third embodiment of the invention is similar to the micro light emitting diode display panel 100 of FIG. 1. The major difference between the two is that the arrangement between the control element and the light emitting unit in each pixel region. In the micro light emitting diode display panel 300, each of the control elements 120 is located between two adjacent light emitting units 130 in the first direction D1. More specifically, in each of the pixel regions PR, the control element 120 is located closest to the green micro light emitting diode 134, and the red micro light emitting diode 132 and the blue micro light emitting diode 136 are respectively located on opposite sides of the green micro light emitting diode 134. In this way, the shortest distance D134 between the green micro light emitting diode 134 and the control element 120 may be less than the shortest distance D132 between the red micro light emitting diode 132 and the control element 120 and the shortest distance D136 between the blue micro light emitting diode 136 and the control element 120.

Figure 4:
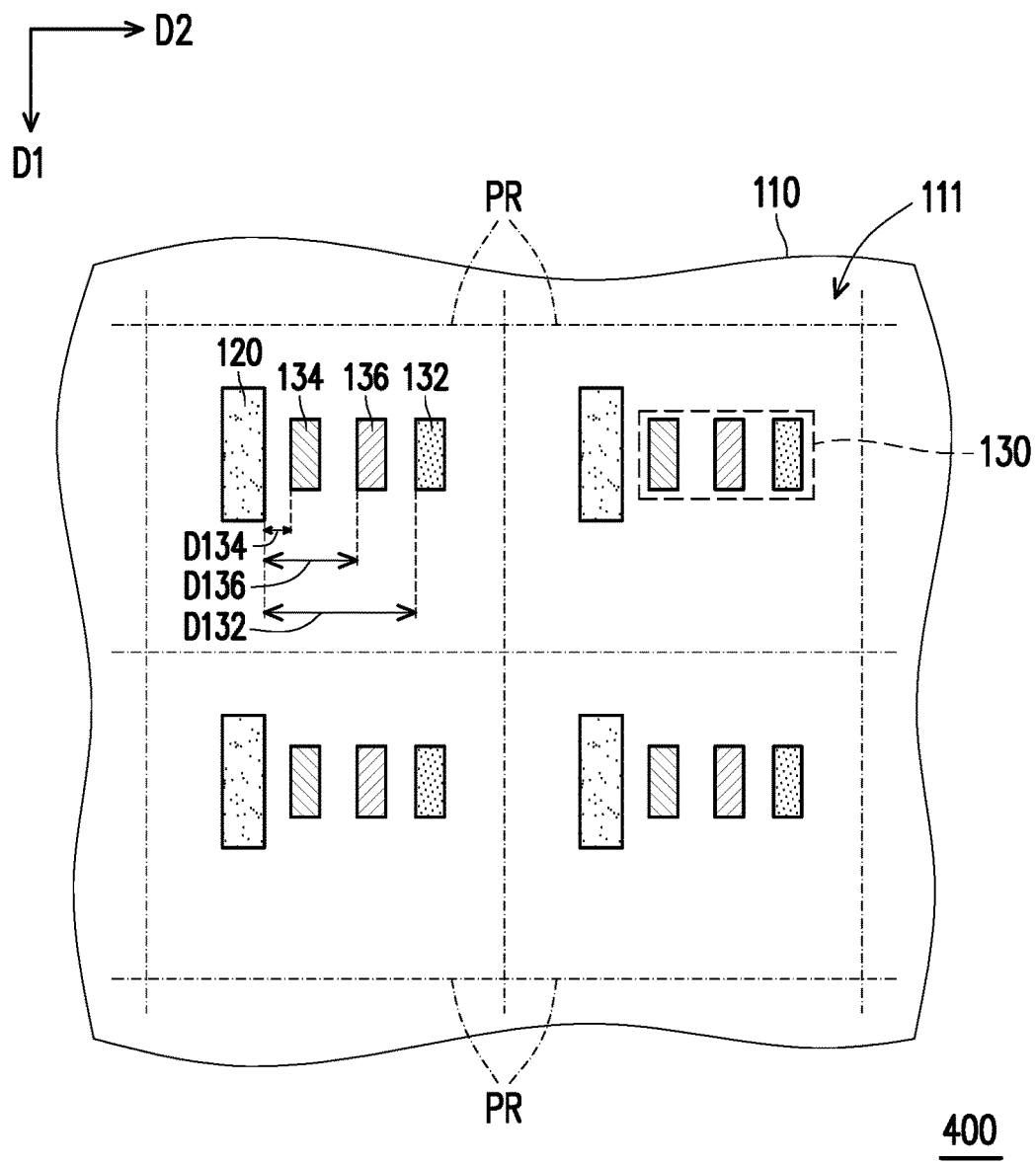

With reference to FIG. 4, a micro light emitting diode display panel 400 of the fourth embodiment of the invention is similar to the micro light emitting diode display panel 100 of FIG. 1. The major difference between the two is that the control elements 120 and the light emitting units 130 are alternately arranged in the second direction D2 in the pixel regions PR of the micro light emitting diode display panel 400. More specifically, the light emitting unit 130 is located on one side of the control element 120, and the green micro light emitting diode 134, the blue micro light emitting diode 136 and the red micro light emitting diode 132 are arranged sequentially (e.g., along the second direction D2) away from the control element 120 in each of the pixel regions PR. In this way, the shortest distance D134 between the green micro light emitting diode 134 and the control element 120 may be less than the shortest distance D136 between the blue micro light emitting diode 136 and the control element 120, and the shortest distance D136 between the blue micro light emitting diode 136 and the control element 120 may be less than the shortest distance D132 between the red micro light emitting diode 132 and the control element 120.

Figure 5:
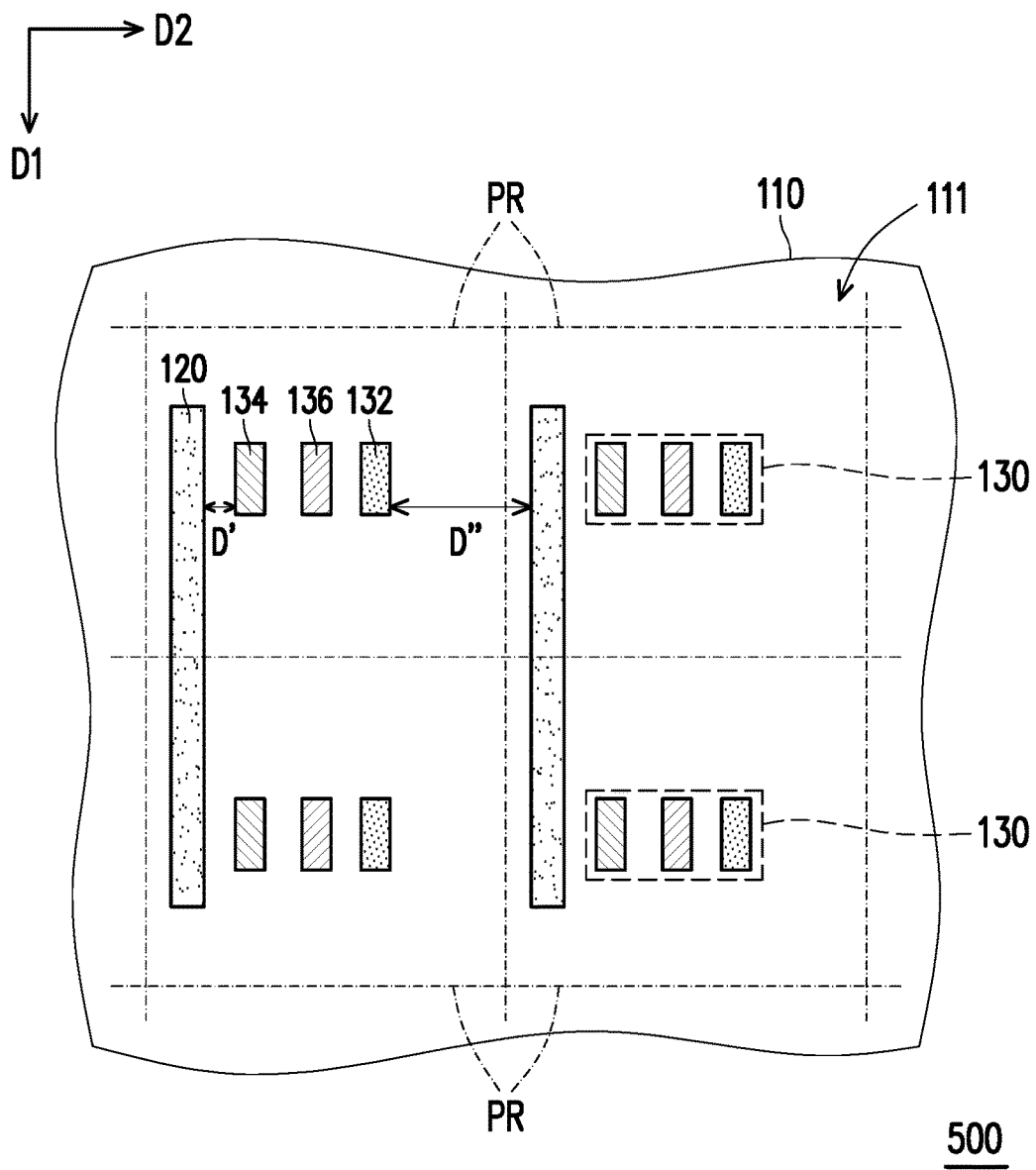

With reference to FIG. 5, a micro light emitting diode display panel 500 of the fifth embodiment of the invention is similar to the micro light emitting diode display panel 400 of FIG. 4. The major difference between the two is described as follows. In the micro light emitting diode display panel 400, the control elements 120 and the pixel regions PR are arranged in a one-to-one manner, while in the micro light emitting diode display panel 500, the control elements 120 and the pixel regions PR are arranged in a one-to-many manner. Specifically, in the micro light emitting diode display panel 500, two of the light emitting units 130 connect to one of the control elements 120. In other words, each of the control elements 120 controls a plurality of the pixel regions PR. More preferably, the blue micro light emitting diode 136 is not placed adjacent to the control elements 120 (including the control elements 120 electrically connected to that blue micro light emitting diode 136 or not). Furthermore, a distance D" between the red micro light emitting diode 132 and the adjacent but not electrically connected control element 120 greater than a distance D' between the green micro light emitting diode 134 (which is located in the same pixel region PR with the red micro light emitting diode 132) and the control element 120 connecting to the green micro light emitting diode 134.

For instance, each of the control elements 120 may be disposed in two adjacent pixel regions PR in the first direction D1, and the two light emitting units 130 electrically connecting to the control element 120 are arranged along the first direction D1 on the same side of the control element 120, but the invention is not limited thereto. In another embodiment, the two light emitting units 130 may also be arranged along the second direction D2 on opposite sides of the control element 120.

Figure 6:
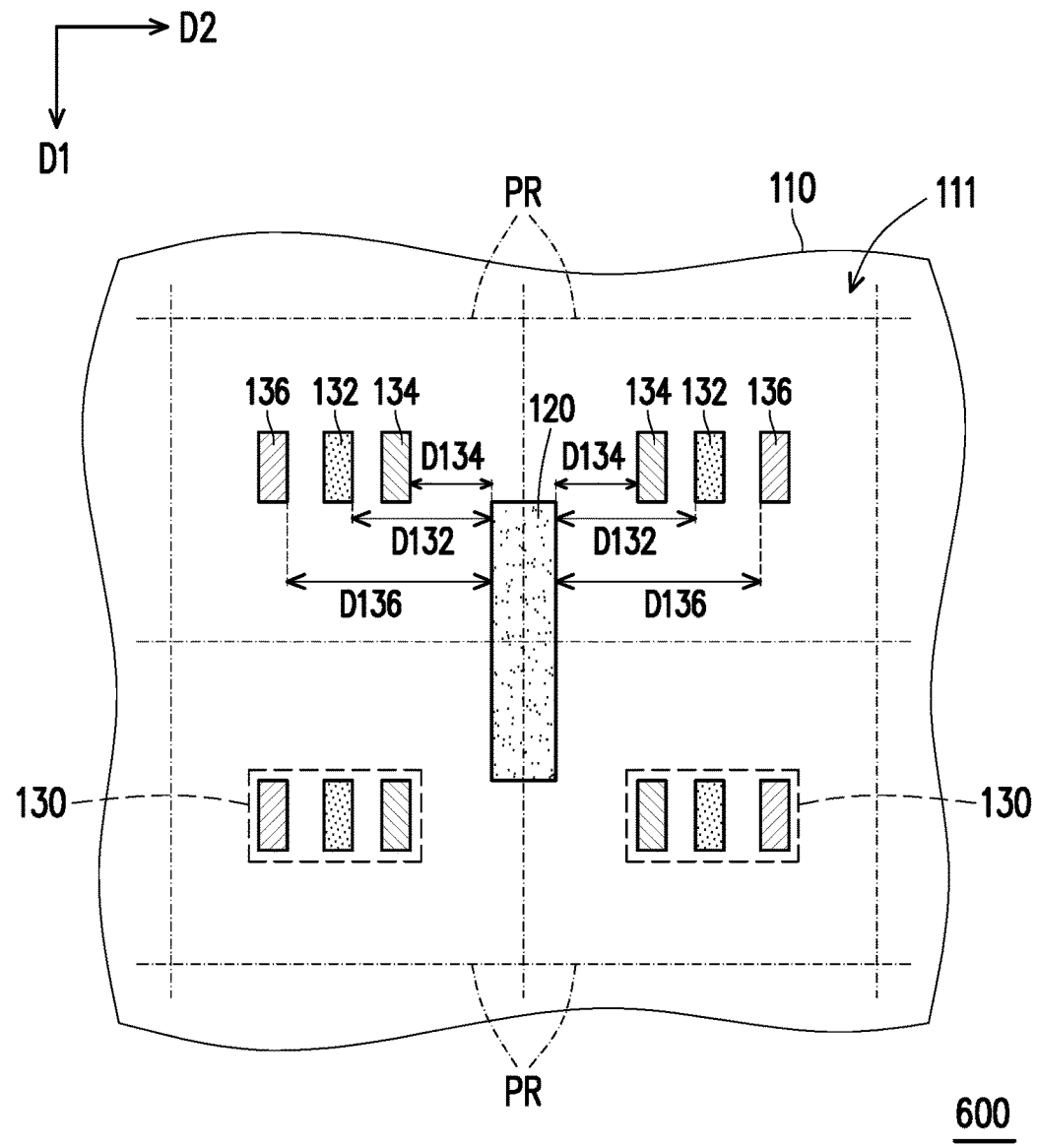

With reference to FIG. 6, a micro light emitting diode display panel 600 of the sixth embodiment of the invention is similar to the micro light emitting diode display panel 500 of FIG. 5. The major difference between the two is described as follows. In the micro light emitting diode display panel 600, each of the control elements 120 controls four adjacent pixel regions PR, in other words, one control element 120 electrically connecting to four light emitting units 130. More preferably, each of the control elements 120 is surrounded with four light emitting units 130.

In said four adjacent pixel regions PR, the green micro light emitting diodes 134, the red micro light emitting diode 132 and the blue micro light emitting diode 136 are disposed far away sequentially from the control element 120. It means that the micro light emitting diodes of the two light emitting units 130 disposed on two opposite sides of the control element 120 in the second direction D2 are arranged with mirror symmetry with the control element 120 as the symmetry axis.

Figure 7:
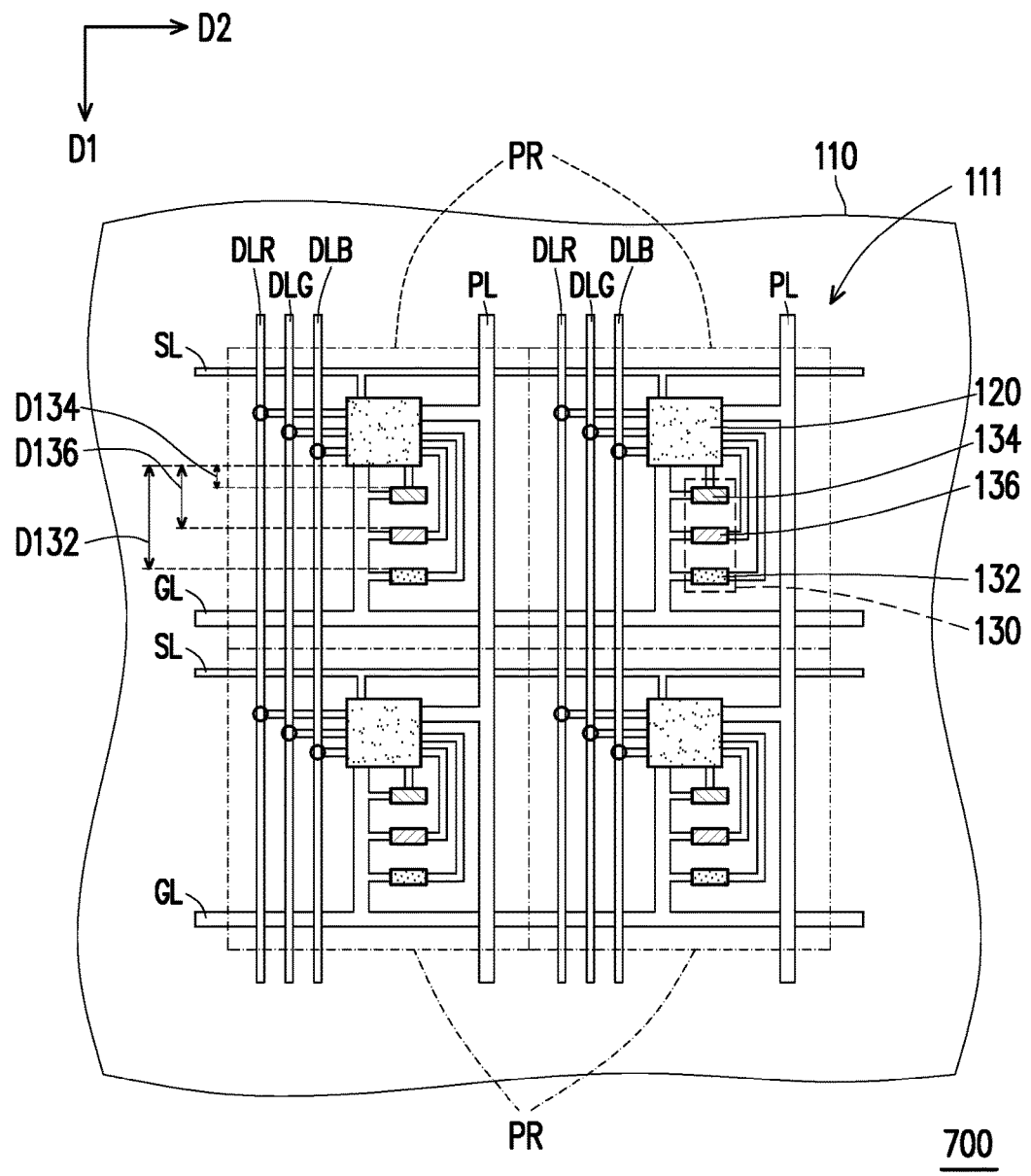

With reference to FIG. 7, a micro light emitting diode display panel 700 of the seventh embodiment of the invention is similar to the micro light emitting diode display panel 400 of FIG. 4. The major differences between the two are described as follows. In the micro light emitting diode display panel 700, the control elements 120 and the light emitting units 130 are alternately arranged in the first direction D1. More specifically, in each of the pixel regions PR, the light emitting unit 130 is located on one side of the control element 120, and the green micro light emitting diode 134, the blue micro light emitting diode 136 and the red micro light emitting diode 132 are arranged in a direction (e.g., the first direction D1) away from the control element 120. The shortest distance D134 between the green micro light emitting diode 134 and the control element 120 may be less than the shortest distance D136 between the blue micro light emitting diode 136 and the control element 120, and the shortest distance D136 may be less than the shortest distance D132 between the red micro light emitting diode 132 and the control element 120.

In another embodiment, positions of the blue micro light emitting diode 136 and the red micro light emitting diode 132 are interchangeable. In this way, the shortest distance D134 between the green micro light emitting diode 134 and the control element 120 may be less than the shortest distance D132 between the red micro light emitting diode 132 and the control element 120, and the shortest distance D132 between the red micro light emitting diode 132 and the control element 120 may be less than the shortest distance D136 between the blue micro light emitting diode 136 and the control element 120.

Wiring lines formed on the substrate 110 are further illustrated in FIG. 7. Specifically, the micro light emitting diode display panel 700 further includes a plurality of scan lines SL, a plurality of first data lines DLR, a plurality of second data lines DLG, a plurality of third data lines DLB, a plurality of power lines PL and a plurality of ground lines GL. The first data lines DLR, the second data lines DLG and the third data lines DLB are configured to transmit a red data signal corresponding to the red micro light emitting diodes 132, a green data signal corresponding to the green micro light emitting diodes 134 and a blue data signal corresponding to the blue micro light emitting diodes 136, respectively.

The scan lines SL, the first data lines DLR, the second data lines DLG, the third data lines DLB, the power lines PL and the ground lines GL are disposed on the substrate 110. In the embodiment, the scan lines SL and the ground lines GL are parallel to each other, and the first data lines DLR, the second data lines DLG, the third data lines DLB and the power lines PL are parallel to one another and intersecting with the scan lines SL and the ground lines GL, but the invention is not limited thereto. The scan lines SL and the ground lines GL may be a first patterned conductive layer formed on the substrate 110, and the first data lines DLR, the second data lines DLG, the third data lines DLB and the power lines PL may be a second patterned conductive layer formed on the substrate 110. Among them, the first patterned conductive layer and the second patterned conductive layer may be electrically insulated from each other through at least one insulation layer (not illustrated).

More specifically, the scan lines SL and the ground lines GL are, for example, alternately arranged along the first direction D1 and respectively extending along the second direction D2. The control elements 120 arranged along the second direction D2 are electrically connected to the same scan line SL and the same ground line GL, and the control elements 120 arranged along the first direction D1 are electrically connected to different scan lines SL and different ground lines GL. The first data lines DLR, the second data lines DLG, the third data lines DLB and the power lines PL are, for example, alternately arranged along the second direction D2 and respectively extending along the first direction D1. The control elements 120 arranged along the first direction D1 are electrically connected to one of the first data line DLR, one of the second data line DLG, one of the third data line DLB and one of the power line PL, and the control elements 120 arranged along the second direction D2 are electrically connected to different first data lines DLR, different second data lines DLG, different third data lines DLB and different power lines PL. In each of the pixel regions PR, the control element 120 and the light emitting unit 130 are, for example, located between the third data line DLB and the power line PL. Nonetheless, extending direction, arrangement direction and disposition position of each element described above may be changed based on actual requirements, instead of being limited to the above.

In addition to being electrically connected to the corresponding light emitting unit 130, each of the control elements 120 is also electrically connected to one of the scan lines SL, one of the first data lines DLR, one of the second data lines DLG, one of the third data lines DLB, one of the power lines PL and one of the ground lines GL. The red micro light emitting diode 132, the green micro light emitting diode 134 and the blue micro light emitting diode 136 in each of the light emitting units 130 are electrically connected to one of the ground lines GL.

Figure 8:
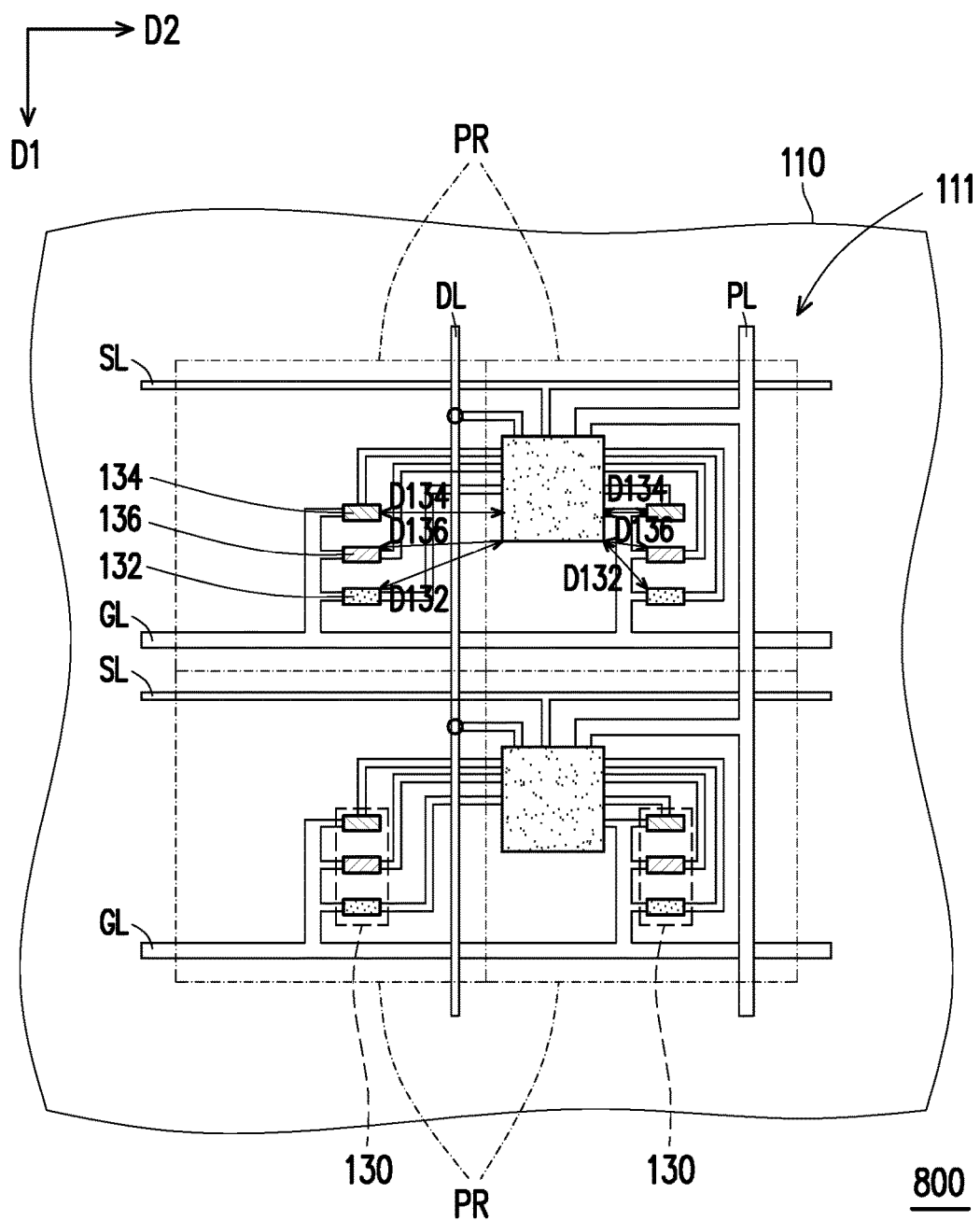

With reference to FIG. 8, a micro light emitting diode display panel 800 of the eighth embodiment of the invention is similar to the micro light emitting diode display panel 700 of FIG. 7. The major differences between the two are described as follows. In the micro light emitting diode display panel 700 of FIG. 7, each of the control elements 120 controls one of the light emitting unit 130 in one of the pixel region PR, while in the micro light emitting diode display panel 800 of FIG. 8, each of the control elements 120 controls a plurality of the micro light emitting units 130. Specifically, in the micro light emitting diode display panel 800, two light emitting units 130 connect to one control element 120.

Further, the micro light emitting diode display panel 700 of FIG. 7 uses the first data lines DLR, the second data lines DLG and the third data lines DLB to transmit the red data signal, the green data signal and the blue data signal, respectively. On the other hand, the micro light emitting diode display panel 800 of FIG. 8 replaces the first data lines DLR, the second data lines DLG and the third data lines DLB by a data line DL, and transmits the red data signal corresponding to the red micro light emitting diodes 132, the green data signal corresponding to the green micro light emitting diodes 134 and the blue data signal corresponding to the blue micro light emitting diodes 136 by the data line DL. Because the red data signal, the green data signal and the blue data signal are all transmitted by the data line DL and one control element control two light emitting units 130, the wiring lines on the substrate 110 may be simplified. The data signals can be stored and sent to each of the micro light emitting diodes by a circuit element design in the control element 120.

In summary, in the micro light emitting diode display panel according to the embodiments of the invention, the border width may be effectively reduced by disposing the control element in the pixel region. Since human eyes are most sensitive to green light and least sensitive to blue light among red light, green light and blue light, the occurrence of significant dark lines or regularly appearing dark spots are prevented from being seen by disposing the control element at a position closer to the green micro light emitting diode than to the blue micro light emitting diode. As a result, the micro light emitting diode display panel can include both the better display quality and the narrower border. In an embodiment, the size of the control element, the red micro light emitting diode, the green micro light emitting diode and the blue micro light emitting diode may be adjusted in response to the applications of the micro light emitting diode display panel. In another embodiment, the size of the red micro light emitting diode may be greater than the size of the green micro light emitting diode and the size of the blue micro light emitting diode, such that the brightness of the red micro light emitting diode may be increased. In yet another embodiment, by arranging the opaque control elements separately from the blue micro light emitting diode, the dark lines may be further prevented from being seen. In still another embodiment, multiple light emitting units can connect to one control element, so as to reduce the number of the control elements required.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A micro light emitting diode display panel, comprising:
   a substrate including a plurality of pixel regions arranged in a display area;
   a plurality of control elements, disposed on the substrate and in the display area; and
   a plurality of light emitting units, disposed on the substrate and in the display area, wherein each of the light emitting units is electrically connected to one of the control elements, and each of the light emitting units comprises a plurality of micro light emitting diodes, wherein the plurality of micro light emitting diodes at least have a red micro light emitting diode, a green micro light emitting diode and a blue micro light emitting diode, and a shortest distance between the green micro light emitting diode and the one of the control elements is less than a shortest distance between the blue micro light emitting diode and the one of the control elements,
   wherein the pixel regions comprise a plurality of first pixel regions and a plurality of second pixel regions, the first pixel regions are sequentially arranged in a first direction, the second pixel regions are sequentially arranged in the first direction, and the first pixel regions and the second pixel regions are alternately arranged in a second direction perpendicular to the first direction, wherein an arrangement between one of the control elements and one of the light emitting units in each of the first pixel regions is different from an arrangement between one of the control elements and one of the light emitting units in each of the second pixel regions.

2. The micro light emitting diode display panel according to claim 1, wherein each of the control elements is a circuit chip electrically bonded to the substrate.

3. The micro light emitting diode display panel according to claim 1, wherein a shortest distance between the red micro light emitting diode and the one of the control elements is less than the shortest distance between the blue micro light emitting diode and the one of the control elements.

4. The micro light emitting diode display panel according to claim 1, wherein in each of the light emitting units, an area of the red micro light emitting diode is greater than an area of the green micro light emitting diode and an area of the blue micro light emitting diode.

5. The micro light emitting diode display panel according to claim 1, wherein an area of each of the control elements is 1 to 50 times an area of the red micro light emitting diode, an area of the green micro light emitting diode or an area of the blue micro light emitting diode.

6. The micro light emitting diode display panel according to claim 1, wherein the pixel regions and the light emitting units are equal in number, there are only one of the light emitting units and one of the control elements electrically connected to the one of the light emitting units in each of the pixel regions.

7. The micro light emitting diode display panel according to claim 6, wherein in each of the pixel regions, the control element and the blue micro light emitting diode are located along a diagonal line, and the red micro light emitting diode and the green micro light emitting diode are located along another diagonal line.

8. The micro light emitting diode display panel according to claim 6, wherein the control element is located on one side of the light emitting unit and adjacent to the green micro light emitting diode of the light emitting unit in each of the pixel regions.

9. The micro light emitting diode display panel according to claim 1, wherein a projected area, on the substrate, of each of the control elements on the substrate is 1 to 50 times that of one of the micro light emitting diodes.

10. The micro light emitting diode display panel according to claim 1, wherein each of the micro light emitting diodes is a light emitting diode chip with a side length between 3 μm to 150 μm.

11. The micro light emitting diode display panel according to claim 1, wherein the pixel regions and the light emitting units are equal in number, and a number of the light emitting units in each of the pixel regions is one, wherein each of the control elements is electrically connected to the light emitting units.

12. The micro light emitting diode display panel according to claim 11, wherein the light emitting unit is located on one side of the control element, and the green micro light emitting diode, the blue micro light emitting diode and the red micro light emitting diode are arranged sequentially away from the control element in each of the pixel regions.

* * * * *